United States Patent
Chou et al.

(10) Patent No.: US 11,513,400 B2
(45) Date of Patent: Nov. 29, 2022

(54) PIXEL ARRAY SUBSTRATE AND DISPLAY DEVICE

(71) Applicant: HannStar Display Corporation, Taipei (TW)

(72) Inventors: Mei-Ling Chou, Tainan (TW); Yao-Chih Chuang, Tainan (TW); Chih-Wei Chen, Tainan (TW); Ming-Chang Yu, Taichung (TW); Chia-Yu Liu, Tainan (TW)

(73) Assignee: HannStar Display Corporation, Taipei (TW)

(*) Notice: Subject to any disclaimer, the term of this patent is extended or adjusted under 35 U.S.C. 154(b) by 0 days.

(21) Appl. No.: 17/329,162

(22) Filed: May 25, 2021

(65) Prior Publication Data
US 2021/0389631 A1   Dec. 16, 2021

(30) Foreign Application Priority Data
Jun. 15, 2020   (CN) .......................... 202010543045.9

(51) Int. Cl.
| | |
|---|---|
| *G02F 1/1343* | (2006.01) |
| *H01L 27/12* | (2006.01) |
| *G02F 1/1368* | (2006.01) |
| *G02F 1/1335* | (2006.01) |

(52) U.S. Cl.
CPC ...... *G02F 1/134309* (2013.01); *G02F 1/1368* (2013.01); *G02F 1/13439* (2013.01); *G02F 1/133553* (2013.01); *H01L 27/1248* (2013.01)

(58) Field of Classification Search
None
See application file for complete search history.

(56) References Cited

U.S. PATENT DOCUMENTS

| | | | | |
|---|---|---|---|---|
| 6,084,650 | A | * 7/2000 | Sekiguchi | ......... G02F 1/133555 349/113 |
| 6,680,765 | B1 | * 1/2004 | Maeda | .............. G02F 1/133553 349/114 |
| 7,092,055 | B2 | * 8/2006 | Maeda | .............. G02F 1/133553 349/114 |

(Continued)

FOREIGN PATENT DOCUMENTS

| | | | |
|---|---|---|---|
| JP | 2003280019 A | * | 10/2003 |
| JP | 2006098757 A | * | 4/2006 |

*Primary Examiner* — Ryan Crockett
(74) *Attorney, Agent, or Firm* — JCIPRNET

(57) ABSTRACT

A pixel array substrate including a substrate, a plurality of pixel structures, and a flat layer is provided. The pixel structures are correspondingly disposed in pixel regions of the substrate. At least one of pixel structure includes an active element, a reflective electrode, and an auxiliary electrode. The reflective electrode is electrically connected to the active element. The auxiliary electrode is electrically connected to the reflective electrode and the active element. A vertical projection of the reflective electrode on the substrate overlaps a vertical projection of the auxiliary electrode on the substrate. An area of the vertical projection of the reflective electrode on the substrate is not greater than an area of the vertical projection of the auxiliary electrode on the substrate. The flat layer is disposed between the auxiliary electrode and the active element. A display device by using the pixel array substrate is also provided.

16 Claims, 8 Drawing Sheets

(56) References Cited

U.S. PATENT DOCUMENTS

| | | | |
|---|---|---|---|
| 7,773,182 B2* | 8/2010 | Kimura | G02F 1/133371 |
| | | | 349/141 |
| 2002/0008815 A1* | 1/2002 | Hanakawa | G02F 1/1345 |
| | | | 349/113 |
| 2004/0027510 A1* | 2/2004 | Iijima | G02F 1/133528 |
| | | | 349/61 |
| 2004/0085498 A1* | 5/2004 | Chang | G02F 1/136213 |
| | | | 349/114 |
| 2004/0189928 A1* | 9/2004 | Yang | G02F 1/13394 |
| | | | 349/155 |
| 2004/0233359 A1* | 11/2004 | Nam | G02F 1/133555 |
| | | | 349/114 |
| 2005/0122451 A1* | 6/2005 | Hong | G02F 1/133555 |
| | | | 349/114 |
| 2007/0153174 A1* | 7/2007 | Kim | G02F 1/133555 |
| | | | 349/114 |
| 2011/0267564 A1* | 11/2011 | Kim | G02F 1/1395 |
| | | | 349/86 |
| 2011/0272697 A1* | 11/2011 | Lee | G02F 1/133555 |
| | | | 257/E33.062 |
| 2012/0300144 A1* | 11/2012 | Lee | G02F 1/139 |
| | | | 349/138 |
| 2017/0176791 A1* | 6/2017 | Kubota | G02F 1/133553 |
| 2018/0157130 A1* | 6/2018 | Sakamoto | G02F 1/133345 |

\* cited by examiner

PIXEL ARRAY SUBSTRATE AND DISPLAY DEVICE

CROSS-REFERENCE TO RELATED APPLICATION

This application claims the priority benefit of China application serial no. 202010543045.9, filed on Jun. 15, 2020. The entirety of the above-mentioned patent application is hereby incorporated by reference herein and made a part of this specification.

BACKGROUND

Technical Field

The disclosure relates to display technologies, and in particular, to a pixel array substrate and a display device.

Description of Related Art

Generally, thin-film transistor liquid crystal display (TFT-LCD) panels may be classified as three categories: a transmissive type, a reflective type, and a transflective type according to utilization of light sources and differences in thin-film transistor array (TFT array) substrates. A reflective TFT-LCD panel mainly utilizes a front-light source or an external light source as a light source. A pixel electrode on a thin-film transistor array substrate is made of metal or other reflective material with a good reflection characteristic, to be adapted for reflecting the front light source or the external light source. At present, a reflective electrode of a reflective liquid crystal display panel is mostly disposed on a flat layer. Further, in order to increase adhesion between the reflective electrode and the flat layer, a transparent conductive film, such as an indium tin oxide (ITO), is usually disposed between the reflective electrode and the flat layer. However, arrangement of this above-mentioned layer increases an additional process step and causes a process variation. In other words, a production yield is reduced, and additional production costs are increased.

SUMMARY

The disclosure provides a pixel array substrate with a pixel structure having a plentiful process margin.

The disclosure provides a display device with a high production yield.

The pixel array substrate of the disclosure includes a substrate, a plurality of pixel structures, and a flat layer. The substrate includes a plurality of pixel regions. The plurality of pixel structures are correspondingly disposed in the pixel regions of the substrate. At least one of the plurality of pixel structures includes an active element, a reflective electrode, and an auxiliary electrode. The reflective electrode is disposed in a corresponding one of the pixel regions and is electrically connected to the active element. The auxiliary electrode is electrically connected to the reflective electrode and the active element. A vertical projection of the reflective electrode on the substrate overlaps a vertical projection of the auxiliary electrode on the substrate. An area of the vertical projection of the reflective electrode on the substrate is not greater than an area of the vertical projection of the auxiliary electrode on the substrate. The flat layer is disposed between the auxiliary electrode and the active element and covers the active element.

In an embodiment of the disclosure, the auxiliary electrode of the pixel array substrate directly contacts the flat layer and the reflective electrode.

In an embodiment of the disclosure, the auxiliary electrode of the pixel array substrate is made of a metal oxide.

In an embodiment of the disclosure, the auxiliary electrode of the pixel array substrate has a first width in a first direction. The reflective electrode has a second width in the first direction, and a difference between the first width and the second width is less than or equal to 11 μm.

In an embodiment of the disclosure, the auxiliary electrode of the pixel array substrate includes a first side edge and a second side edge opposite to each other in the first direction. The reflective electrode has a third side edge and a fourth side edge opposite to each other in the first direction. A first distance is provided between the first side edge and the third side edge, and a second distance is provided between the second side edge and the fourth side edge. A sum of the first distance and the second distance is less than or equal to 11 μm.

In an embodiment of the disclosure, the auxiliary electrode of the pixel array substrate is made of metal or alloy.

In an embodiment of the disclosure, the auxiliary electrode of the pixel array substrate has a first width in a first direction. The reflective electrode has a second width in the first direction, and a difference between the first width and the second width is greater than or equal to 0.5 μm and less than or equal to 4.5 μm.

In an embodiment of the disclosure, the auxiliary electrode of the pixel array substrate includes a first side edge and a second side edge opposite to each other in the first direction. The reflective electrode has a third side edge and a fourth side edge opposite to each other in the first direction. A first distance is provided between the first side edge and the third side edge. A second distance is provided between the second side edge and the fourth side edge, and one of the first distance and the second distance is greater than or equal to 0.25 μm and less than or equal to 2.25 μm.

In an embodiment of the disclosure, a reflective electrode of the pixel array substrate includes a first surface facing away from the substrate. The auxiliary electrode includes a second surface not covered by the reflective electrode, and the first surface and the second surface define a reflective surface of the pixel structure.

In an embodiment of the disclosure, the reflective electrode of the pixel array substrate is a stacked structure of a transparent protective layer and a metal reflective layer, and the metal reflective layer is disposed between the transparent protective layer and the auxiliary electrode.

In an embodiment of the disclosure, reflectivity of the auxiliary electrode of the pixel array substrate in a visible light band is different from reflectivity of the reflective electrode in the visible light band.

In an embodiment of the disclosure, the reflective electrode of the pixel array substrate is made of silver or silver alloy, the auxiliary electrode is a stacked structure of a metal layer and a metal oxide layer, and the metal oxide layer is disposed between the metal layer and the flat layer.

The display device of the disclosure includes a pixel array substrate, a display medium layer, and an opposite substrate. The display medium layer is sandwiched between the pixel array substrate and the opposite substrate. The pixel array substrate includes a substrate, a plurality of pixel structures, and a flat layer. The substrate includes a plurality of pixel regions. The plurality of pixel structures are correspondingly disposed in the pixel regions of the substrate. At least one of the plurality of pixel structures includes an active element, a reflective electrode, and an auxiliary electrode. The reflective electrode is disposed in a corresponding one of the pixel regions and is electrically connected to the active element. The auxiliary electrode is electrically connected to the reflective electrode and the active element. A vertical projection of the reflective electrode on the substrate overlaps a vertical projection of the auxiliary electrode on the substrate. An area of the vertical projection of the reflective electrode on the substrate is not greater than an area of the vertical projection of the auxiliary electrode on the substrate. The flat layer is disposed between the auxiliary electrode and the active element and covers the active element.

In an embodiment of the disclosure, the auxiliary electrode of the display device directly contacts the flat layer and the reflective electrode. The reflective electrode is made of silver or silver alloy. The flat layer is made of an organic insulating material.

In an embodiment of the disclosure, the auxiliary electrode of the display device is made of a metal oxide.

In an embodiment of the disclosure, the auxiliary electrode of the display device has a first width in a first direction. The reflective electrode has a second width in the first direction, and a difference between the first width and the second width is less than or equal to 11 µm.

In an embodiment of the disclosure, the auxiliary electrode of the display device includes a first side edge and a second side edge opposite to each other in the first direction. The reflective electrode has a third side edge and a fourth side edge opposite to each other in the first direction. A first distance is provided between the first side edge and the third side edge. A second distance is provided between the second side edge and the fourth side edge. A sum of the first distance and the second distance is less than or equal to 11 µm.

In an embodiment of the disclosure, the auxiliary electrode of the display device is made of metal or alloy.

In an embodiment of the disclosure, the auxiliary electrode of the display device has a first width in a first direction. The reflective electrode has a second width in the first direction, and a difference between the first width and the second width is greater than or equal to 0.5 µm and less than or equal to 4.5 µm.

In an embodiment of the disclosure, the auxiliary electrode of the display device includes a first side edge and a second side edge opposite to each other in the first direction. The reflective electrode has a third side edge and a fourth side edge opposite to each other in the first direction. A first distance is provided between the first side edge and the third side edge. A second distance is provided between the second side edge and the fourth side edge, and one of the first distance and the second distance is greater than or equal to 0.25 µm and less than or equal to 2.25 µm.

Based on the foregoing, in the pixel array substrate and the display device in an embodiment of the disclosure, in order to improve the adhesion between the reflective electrode and the flat layer, the auxiliary electrode is sandwiched between the reflective electrode and the flat layer of the pixel structure, and the area of the vertical projection of the reflective electrode on the substrate is not greater than the area of the vertical projection of the auxiliary electrode on the substrate. Accordingly, a process margin of the pixel array substrate may be increased, and that the production yield of the display device is improved.

DESCRIPTION OF THE EMBODIMENTS

Figure 1:
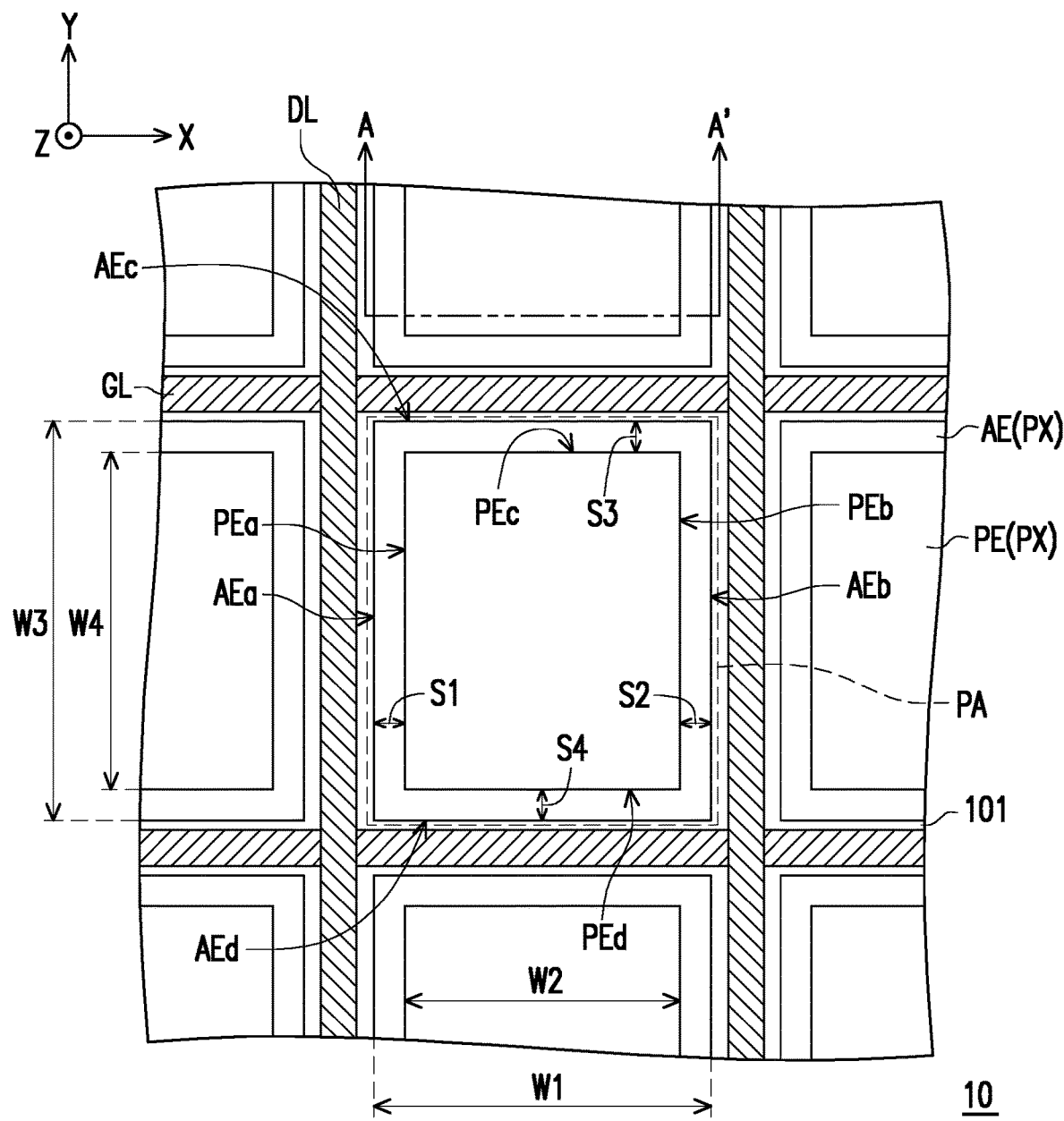
FIG. 1 is a schematic top view of a display device according to a first embodiment of the disclosure.

The foregoing and other technical content, features, and effects of the present disclosure can be clearly presented below in detailed description with reference to preferred embodiments of the reference drawings. The directional terms mentioned in the embodiments like "above", "below", "left", "right", "front", and "back", refer to the directions in the accompanying drawings. Therefore, the directional terms are only used for illustration instead of limiting the disclosure. The following describes this disclosure by listing some embodiments of the disclosure. Whenever possible, the same component symbols are used in the drawings and descriptions to indicate the same or similar parts.

Figure 2:
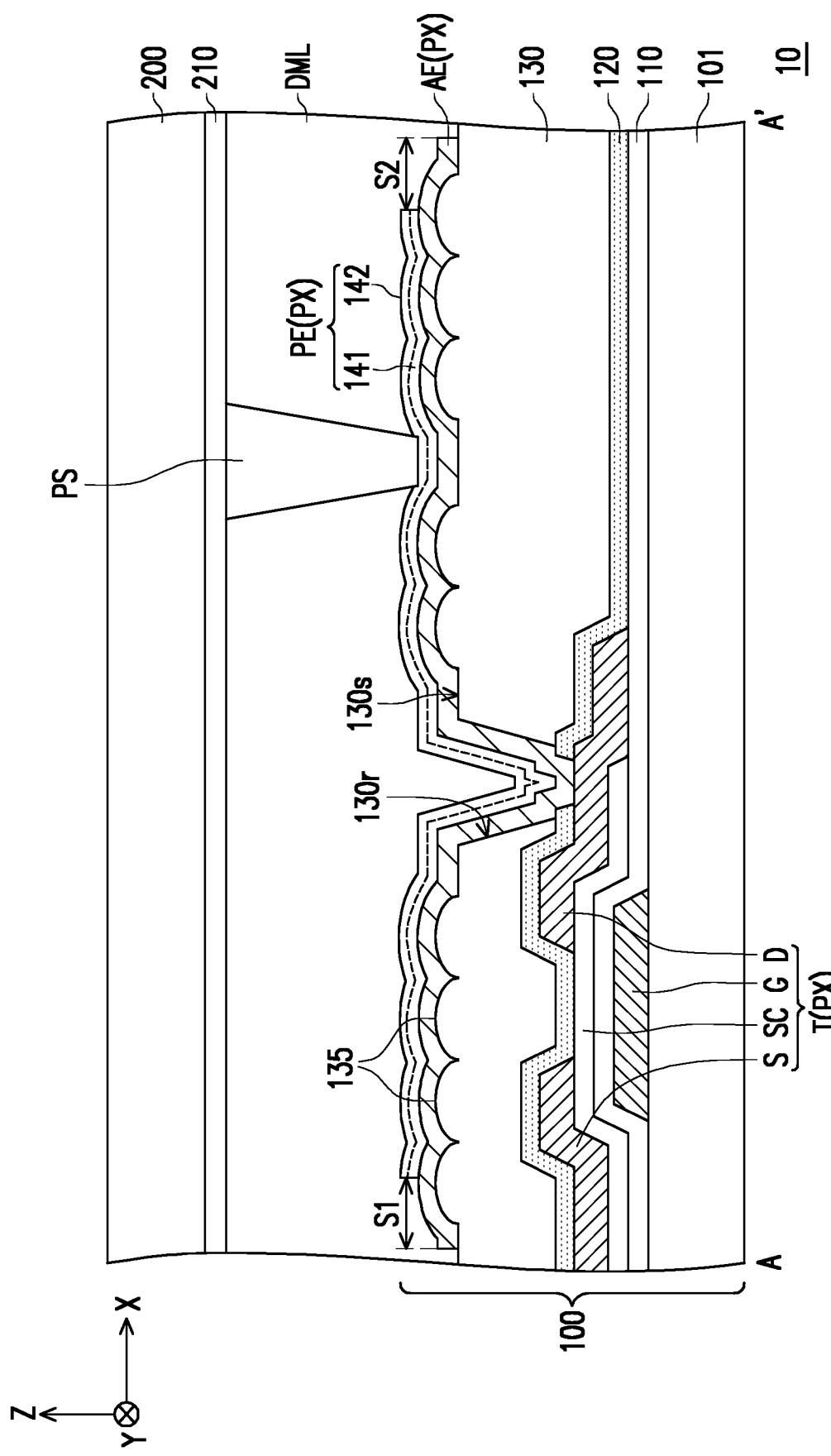
FIG. 2 is a schematic cross-sectional view of the display device of FIG. 1.

FIG. 1 is a schematic top view of a display device according to a first embodiment of the disclosure. FIG. 2 is a schematic cross-sectional view of the display device of FIG. 1. FIG. 2 corresponds to a section line A-A' of FIG. 1. In particular, for the sake of clarity, FIG. 1 only shows a scan line GL, a data line DL, and a substrate 101, a reflective electrode PE, and an auxiliary electrode AE of FIG. 2.

Referring to FIG. 1 and FIG. 2, a display device 10 includes a pixel array substrate 100, an opposite substrate 200, and a display medium layer DML. The pixel array substrate 100 is disposed opposite to the opposite substrate 200. The display medium layer DML is sandwiched between the pixel array substrate 100 and the opposite substrate 200. In the present embodiment, the display medium layer DML is, for example, a liquid crystal layer, and includes a plurality of liquid crystal molecules (not shown). The opposite substrate 200 is, for example, a color filter substrate. For example, the color filter substrate may include a plurality of color filter patterns (not shown) and light-shielding pattern layers (not shown), but the disclosure is not limited thereto. In other embodiments, the opposite substrate 200 may not be provided with the color filter pattern. In other words, the display device 10 is, for example, a liquid crystal display panel. It should be understood that, in order to control a thickness of the display medium layer DML at a specific value, the display device 10 further includes a spacer PS sandwiched between the pixel array substrate 100 and the opposite substrate 200. The spacer PS may be made of an etching material, but the disclosure is not limited thereto.

Further, the pixel array substrate 100 includes a substrate 101, a plurality of data lines DL, a plurality of scan lines GL, and a plurality of pixel structures PX. The substrate 101 includes a plurality of pixel regions PA. For example, the plurality of data lines DL are arranged along a direction X and extend in a direction Y, and the plurality of scanning lines GL are arranged along the direction Y and extend in a direction X, the direction X intersecting the direction Y. In other words, the data lines DL intersect the scan lines GL and define a plurality of pixel regions PA of the pixel array substrate 100. The pixel structures PX are disposed in the pixel regions PA of the substrate 101, and at least one of them include an active element T and a reflective electrode PE electrically connected to each other. For example, the active element T of each pixel structure PX may be electrically connected to a corresponding scan line GL and a corresponding data line DL, but the disclosure is not limited thereto. The reflective electrode PE is configured to drive a liquid crystal molecule (not shown) of the display medium layer DML, and is further configured to reflect light from the surrounding environment or a front-light source to achieve a display effect. In the present embodiment, the reflective electrode PE may be made of metal (e.g., silver), alloy (e.g., silver alloy), nitride of a metal material, an oxide of the metal material, an oxynitride of the metal material, or other suitable material.

In the present embodiment, the display device 10 may further include a conductive layer 210 (e.g., a common electrode layer) disposed on the opposite substrate 200. An electric field formed between the conductive layer 210 and the reflective electrode PE of the pixel structure PX may drive a plurality of liquid crystal molecules (not shown) of the display medium layer DML to rotate to form an arrangement corresponding to a magnitude of the electric field. In the present embodiment, the conductive layer 210 is a light-transmissive electrode. The light-transmissive electrode is made of a metal oxide, for example: indium tin oxide, indium zinc oxide, aluminum tin oxide, aluminum zinc oxide, or other suitable oxides, or a stack layer of at least two of the foregoing materials.

For example, in the present embodiment, the display medium layer DML may be driven in an electrically controlled birefringence (ECB) mode, but the disclosure is not limited thereto. In other embodiments, the display medium layer DML may further be driven in a twisted nematic (TN), a super twisted nematic (STN), a vertical alignment (VA), or an optically compensated birefringence (OCB) mode. It should be understood that under different driving modes, a conductive layer 210 may further not be disposed on the opposite substrate 200 of the display device, and the display medium layer DML is driven in an in-plane switching (IPS) or a fringe field switching (FFS) mode.

In the present embodiment, a method for forming an active element T may include the following steps. A gate G, a gate insulating layer 110, a semiconductor pattern SC, a source S, a drain D, and an insulating layer 120 are sequentially formed on a substrate 101, but the disclosure is not limited thereto. The semiconductor pattern SC overlaps the gate G in a normal direction (for example, a direction Z) of the substrate 101. The source S and the drain D overlap the semiconductor pattern SC and are electrically connected to two different regions of the semiconductor pattern SC, for example, a source region (not shown) and a drain region (not shown). For example, in the present embodiment, the gate G of the active element T is optionally disposed under the semiconductor pattern SC to form a bottom-gate thin-film transistor (bottom-gate TFT), but the disclosure is not limited thereto. In other embodiments, the gate of the active element may further be optionally disposed above the semiconductor pattern to form a top-gate thin film transistor (top-gate TFT). In the present embodiment, the source S, the drain D, and the data line DL of the active element T are optionally at a same layer, and the gate G and the scan line GL are optionally at a same layer, but the disclosure is not limited thereto.

It should be noted that the gate G, the source S, the drain D, the semiconductor pattern SC, the gate insulating layer 110, and the insulating layer 120 may be respectively implemented by any gate, any source, any drain, any semiconductor pattern, any gate insulating layer, and any insulating layer that is used in a display panel and that is known to those skilled in the art, and the gate G, source S, the drain D, the semiconductor pattern SC, the gate insulating layer 110, and the insulating layer 120 may be respectively formed by any method well known to those skilled in the art, and the descriptions thereof are omitted herein.

In the present embodiment, the pixel array substrate 100 may further include a flat layer 130 disposed on the insulating layer 120. The flat layer 130 covers the active element T, and has an opening 130r overlapping the drain D of the active element T. A reflective electrode PE is disposed on the flat layer 130 and extends into the opening 130r to be electrically connected to the drain D of the active element T. The flat layer 130 may be made of an organic insulating material, an inorganic insulating material, or a combination thereof. In order to increase uniformity of emitted light reflected by the reflective electrode PE, a surface 130s of the flat layer 130 may be provided with a plurality of optical microstructures 135, but the disclosure is not limited thereto.

In order to increase adhesion between the reflective electrode PE and the flat layer 130 to prevent the reflective electrode PE from being peeled off from the flat layer 130, a pixel structure PX of the pixel array substrate 100 further includes an auxiliary electrode AE connected between the reflective electrode PE and the flat layer 130 (or the active element T). The flat layer 130 is disposed between the auxiliary electrode AE and the active element T. In the present embodiment, the auxiliary electrode AE directly covers (or contacts) the flat layer 130 and extends into the opening 130r of the flat layer 130 to be directly electrically connected to the drain D of the active element T, and the reflective electrode PE directly covers (or contacts) the auxiliary electrode AE to be electrically connected to the drain D of the active element T. For example, the auxiliary electrode AE may be made of a metal oxide, including an indium tin oxide (ITO), an indium zinc oxide (IZO), an indium oxide ($In_2O_3$), and a tin dioxide ($SnO_2$), a zinc oxide (ZnO), a cadmium oxide (CdO), a titanium nitride (TiN), an aluminum zinc oxide (AZO), or a gallium zinc oxide (GZO), but the disclosure is not limited thereto.

It should be noted that a vertical projection of the reflective electrode PE on the substrate 101 completely overlaps a vertical projection of the auxiliary electrode AE on the substrate 101. An area of the vertical projection of the reflective electrode PE on the substrate 101 is not greater than an area of the vertical projection of the auxiliary electrode AE on the substrate 101. Accordingly, an alignment margin between the auxiliary electrode AE and the reflective electrode PE and an allowable variation in etching may be increased. In other words, a process margin of the pixel array substrate 100 may be increased, such that a production yield of the display device 10 is increased.

In the present embodiment, the area of the vertical projection of the reflective electrode PE on the substrate 101 is optionally less than the area of the vertical projection of the auxiliary electrode AE on the substrate 101, but the disclosure is not limited thereto. For example, the auxiliary electrode AE has a width W1 in a direction X, the reflective electrode PE has a width W2 in the direction X. A width W1 of the auxiliary electrode AE is greater than a width W2 of the reflective electrode PE. Similarly, the auxiliary electrode AE and the reflective electrode PE have a width W3 and a width W4 in a direction Y, respectively. A width W3 of the auxiliary electrode AE is greater than a width W4 of the reflective electrode PE. In the present embodiment, a difference between the width W1 of the auxiliary electrode AE and a width W2 of the reflective electrode PE and a difference between the width W3 of the auxiliary electrode AE and the width W4 of the reflective electrode PE are less than or equal to 11 μm, but the disclosure is not limited thereto.

From another point of view, the auxiliary electrode AE has a side edge AEa and a side edge AEb opposite to each other in the direction X, and the reflective electrode PE has a side edge PEa and a side edge PEb opposite to each other in the direction X. There is a first distance S1 between the side edge AEa of the auxiliary electrode AE and the side edge PEa of the reflective electrode PE. The first distance S1 is greater than or equal to 0 μm and less than or equal to 5.5 μm. There is a second distance S2 between the side edge AEb of the auxiliary electrode AE and the side edge PEb of the reflective electrode PE. In the present embodiment, a sum of the first distance S1 and the second distance S2 is less than or equal to 11 μm, but the disclosure is not limited thereto.

Similarly, the auxiliary electrode AE has a side edge AEc and a side edge AEd opposite to each other in the direction Y, and the reflective electrode PE has a side edge PEc and a side edge PEd opposite to each other in the direction Y. There is a third distance S3 between the side edge AEc of the auxiliary electrode AE and the side edge PEc of the reflective electrode PE. The third distance S3 is greater than or equal to 0 μm and less than or equal to 5.5 μm. There is a fourth distance S4 between a side edge AEd of the auxiliary electrode AE and a side edge PEd of the reflective electrode PE. In the present embodiment, a sum of the third distance S3 and the fourth distance S4 is less than or equal to 11 μm, but the disclosure is not limited thereto.

For example, in the present embodiment, the first distance S1 between the side edge AEa of the auxiliary electrode AE and the side edge PEa of the reflective electrode PE may be substantially equal to the second distance S2 between the side edge AEb of the auxiliary electrode AE and the side edge PEb of the reflective electrode PE, and the third distance S3 between the side edge AEc of the auxiliary electrode AE and the side edge PEc of the reflective electrode PE may be substantially equal to the fourth distance S4 between the side edge AEd of the auxiliary electrode AE and the side edge PEd of the reflective electrode PE, but the disclosure is not limited thereto.

Further, in order to prevent the reflective electrode PE from oxidizing in a subsequent process and reducing reflectivity of the reflective electrode, the reflective electrode PE of the present embodiment may be a stacked structure of a metal reflective layer 141 and a transparent protective layer 142. The metal reflective layer 141 is disposed between the transparent protective layer 142 and the auxiliary electrode AE. In the present embodiment, the metal reflective layer 141 is made of silver or silver alloy, and the transparent protective layer 142 is made of an indium tin oxide, an inorganic insulating material (such as a silicon oxide or a silicon nitride) or an organic insulating material (such as organic resin), but the disclosure is not limited thereto.

The following describes this disclosure in detail by listing some other embodiments.

The same component is indicated by the same reference numerals, and the description of the same technical content is omitted. For the omitted parts, refer to the foregoing embodiments. Details are not described herein again.

Figure 3:
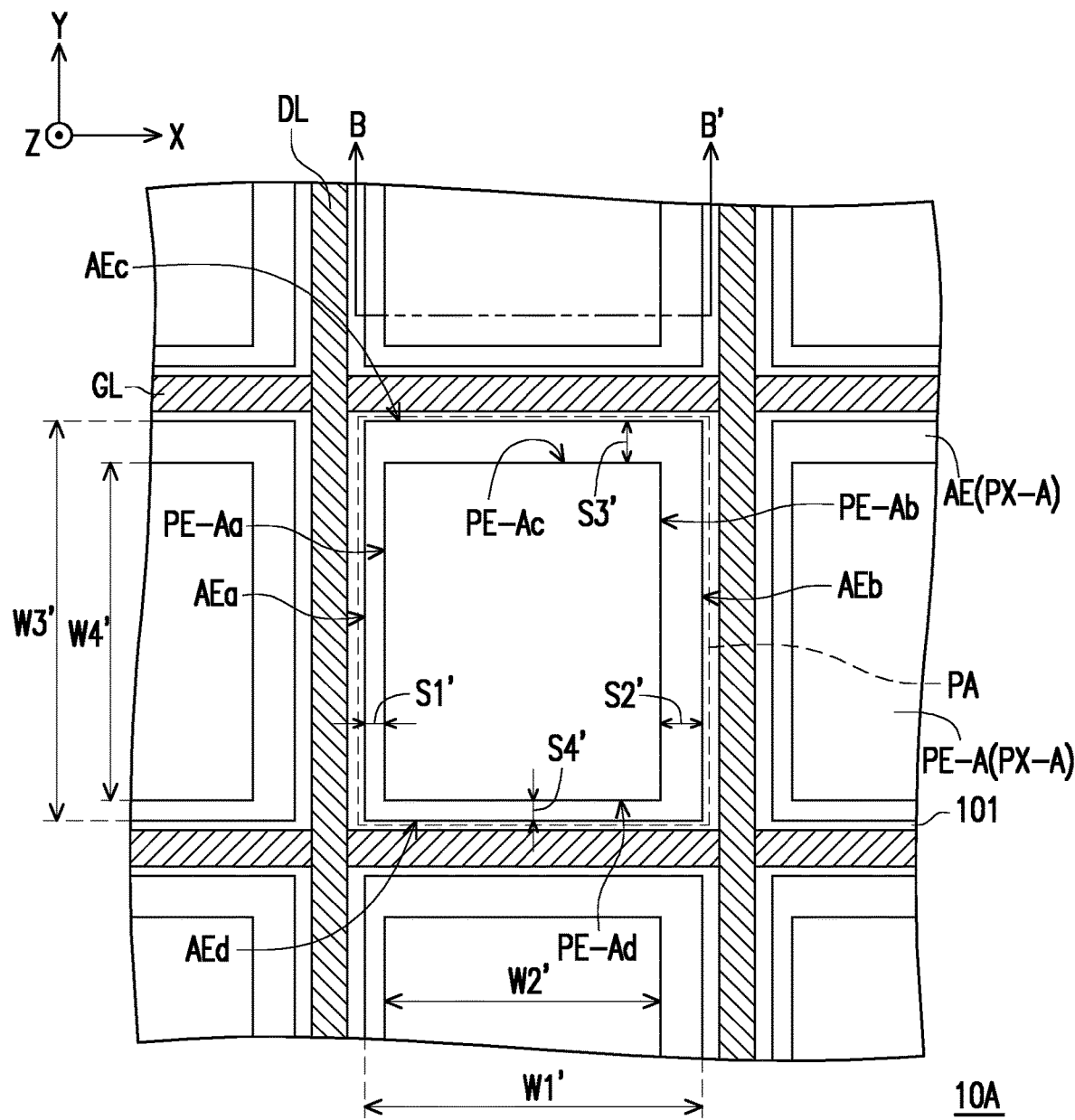
FIG. 3 is a schematic top view of a display device according to a second embodiment of the disclosure.
Figure 4:
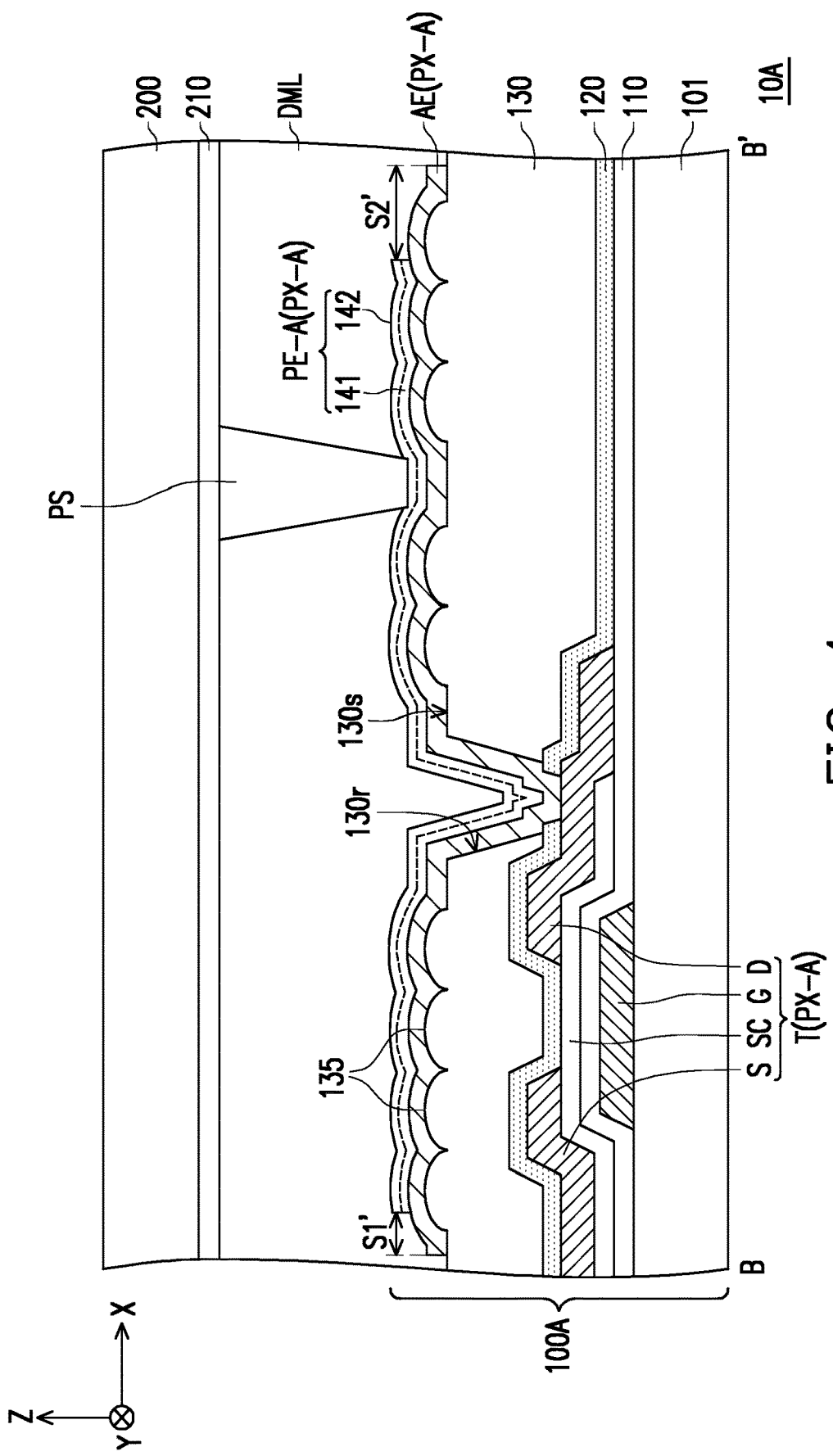
FIG. 4 is a schematic cross-sectional view of the display device of FIG. 3.

FIG. 3 is a schematic top view of a display device according to a second embodiment of the disclosure. FIG. 4 is a schematic cross-sectional view of the display device of FIG. 3. FIG. 4 corresponds to a section line A-A' of FIG. 3. In particular, for the sake of clarity, FIG. 3 only shows a scan line GL, a data line DL, and a substrate 101, a reflective electrode PE-A, and an auxiliary electrode AE of FIG. 4. Referring to FIG. 3 and FIG. 4, a difference between a display device 10A of the present embodiment and the display device 10 of FIG. 1 and FIG. 2 is that: relative positions of the reflective electrode and the auxiliary electrode are different.

In the present embodiment, a first distance S1' between a side edge AEa of the auxiliary electrode AE and a side edge PE-Aa of the reflective electrode PE-A is less than a second distance S2' between a side edge AEb of the auxiliary electrode AE and a side edge PE-Ab of the reflective electrode PE-A, and a third distance S3' between a side edge AEc of the auxiliary electrode AE and a side edge PE-Ac of the reflective electrode PE-A is greater than a fourth distance S4' between a side edge AEd of the auxiliary electrode AE and a side edge PE-Ad of the reflective electrode PE-A. In other words, a vertical projection of the reflective electrode PE-A on the auxiliary electrode AE is closer to the side edge AEa and the side edge AEd of the auxiliary electrode AE. For example, during manufacturing of a pixel structure PX-A, because the auxiliary electrode AE and the reflective electrode PE-A are formed in different etching steps, an alignment margin between the reflective electrode PE-A and the auxiliary electrode AE and a variation amount of etching of the reflective electrode PE-A causes the foregoing offset of the reflective electrode PE-A relative to the auxiliary electrode AE.

Therefore, an area of the vertical projection of the auxiliary electrode AE on the substrate 101 is greater than an area of the vertical projection of the reflective electrode PE-A on the substrate 101 to prevent the reflective electrode PE-A from directly contacting the flat layer 130 and thereby causing a decrease in adhesion. From another point of view, the alignment margin between the auxiliary electrode AE and the reflective electrode PE-A and the variation amount of etching may be increased. In other words, a process margin of the pixel array substrate 100A may be increased, such that a production yield of the display device 10A is improved.

Figure 5:
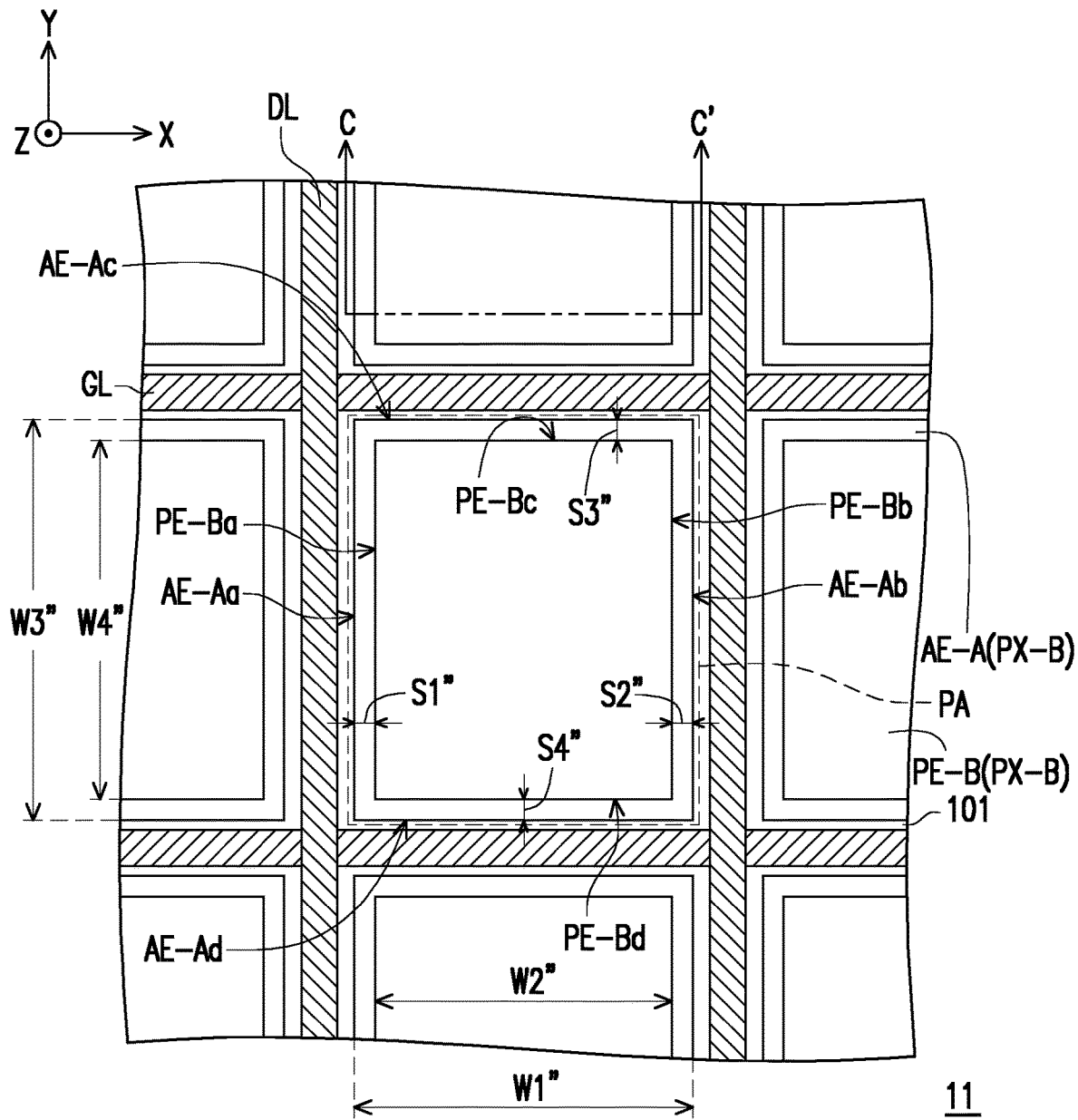
FIG. 5 is a schematic cross-sectional view of a display device according to a third embodiment of the disclosure.
Figure 6:
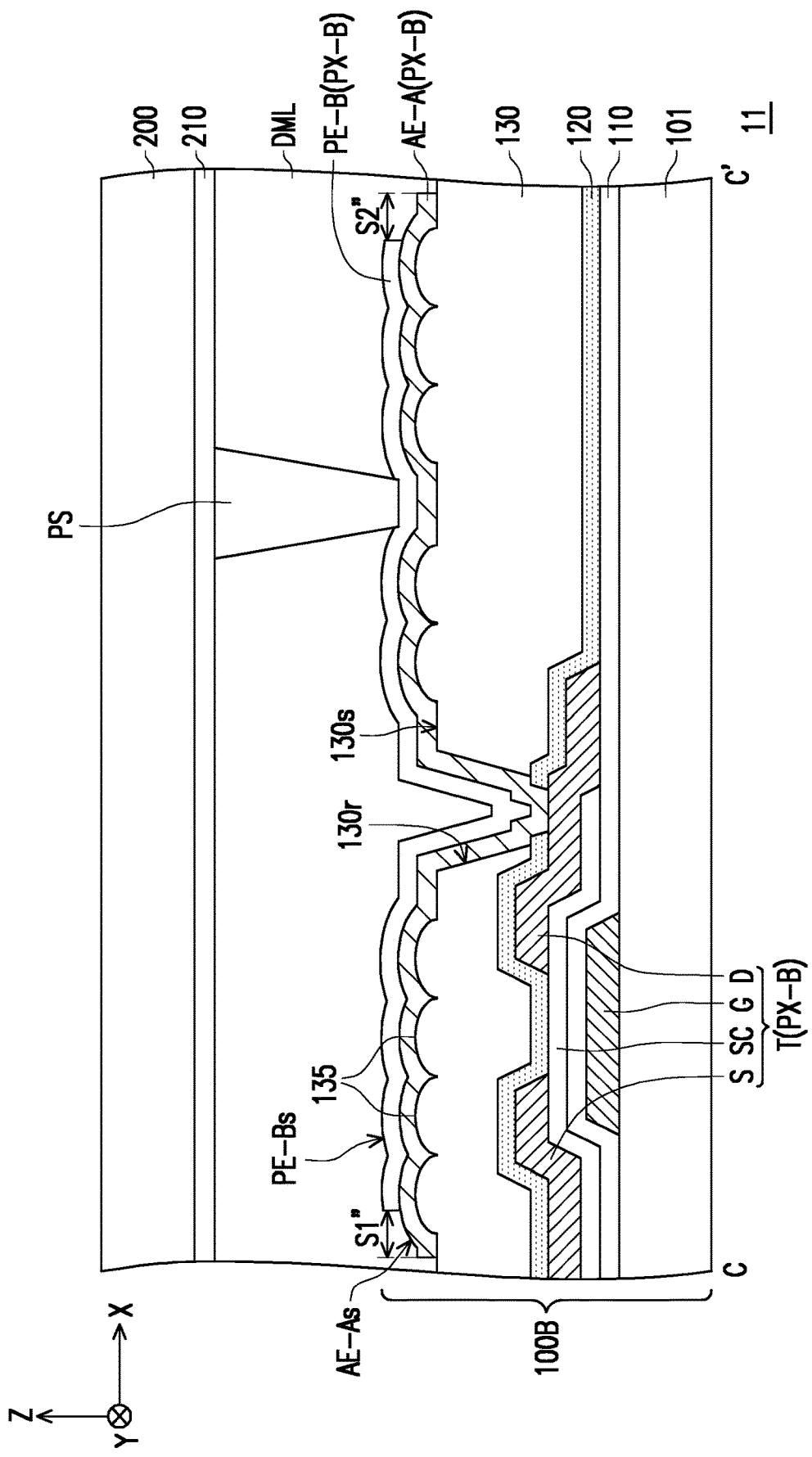
FIG. 6 is a schematic cross-sectional view of the display device of FIG. 5.

FIG. 5 is a schematic cross-sectional view of a display device according to a third embodiment of the disclosure. FIG. 6 is a schematic cross-sectional view of the display device of FIG. 5. FIG. 6 corresponds to a section line C-C' of FIG. 5. In particular, for the sake of clarity, FIG. 5 only shows a scan line GL, a data line DL, and a substrate 101, a reflective electrode PE-B, and an auxiliary electrode AE-A of FIG. 6. Referring to FIG. 5 and FIG. 6, a difference between a display device 11 of the present embodiment and the display device 10 of FIG. 2 is that: materials of auxiliary electrodes are different, and the compositions and the configurations of the reflective electrodes are different. In the present embodiment, an auxiliary electrode AE-A of a pixel structure PX-B of a pixel array substrate 100B may be made of metal or alloy, for example: molybdenum, aluminum, or molybdenum aluminum alloy, but the disclosure is not limited thereto. In other embodiments, the auxiliary electrode AE-A may further be made of nickel, chromium, copper, titanium, or a combination of the materials. In addition, the reflective electrode PE-A of the present embodiment may not have the transparent protective layer 142 as shown in FIG. 2.

Reflectivity of the auxiliary electrode AE-A in a visible light band may be different from reflectivity of the reflective electrode PE-B in the visible light band. In the present embodiment, the reflective electrode PE-B is made of, for example, silver or silver alloy, and the auxiliary electrode AE-A is made of, for example, molybdenum, aluminium, or molybdenum aluminum alloy. Therefore, reflectivity of the reflective electrode PE-B may be greater than 96%, and reflectivity of the auxiliary electrode AE-A may be greater than 88%. In other words, in the present embodiment, a surface PE-Bs of the reflective electrode PE-B facing away from the substrate 101 and a surface AE-As of the auxiliary electrode AE-A not covered by the reflective electrode PE-B may define a reflective surface of the pixel structure PX-B. Accordingly, compared with the foregoing embodiment (that is, the display device 10 of FIG. 2), the auxiliary electrode AE-A of the present embodiment may further increase overall reflectivity of the pixel structure PX-B.

For example, because the auxiliary electrode AE-A and the reflective electrode PE-B are etched in different etching rates in an etching solution (such as aluminate), during manufacturing of the pixel structure PX-B, patterning may be performed by using a same photo-mask and the auxiliary electrode AE-A and the reflective electrode PE-B are formed in a same etching step. In other words, a manufacturing process of the pixel structure PX-B may be simplified and a design margin thereof may be increased.

In the present embodiment, a difference between a width W1" of the auxiliary electrode AE-A and a width W2" of the reflective electrode PE-B and a difference between a width W3" of the auxiliary electrode AE-A and a width W4" of the reflective electrode PE-B may be greater than or equal to 0.5 µm and less than or equal to 4.5 µm. For example, a first distance S1" between a side edge AE-Aa of the auxiliary electrode AE-A and a side edge PE-Ba of the reflective electrode PE-B, a second distance S2" between a side edge AE-Ab of the auxiliary electrode AE-A and a side edge PE-Bb of the reflective electrode PE-B, a third distance S3" between a side edge AE-Ac of the auxiliary electrode AE-A and a side edge PE-Bc of the reflective electrode PE-B, and a fourth distance S4" between a side edge AE-Ad of the auxiliary electrode AE-A and a side edge PE-Bd of the reflective electrode PE-B are optionally greater than or equal to 0.25 µm and less than or equal to 2.25 µm, but the disclosure is not limited thereto. In other embodiments, one of the third distance S3" and the fourth distance S4" is greater than or equal to 0.25 µm and less than or equal to 2.25 µm. Accordingly, an alignment margin between the auxiliary electrode AE-A and the reflective electrode PE-B and an allowable variation amount of etching may be increased. In other words, a manufacturing margin of the pixel array substrate 100B may be increased, such that a production yield of the display device 11 is improved.

Figure 7:
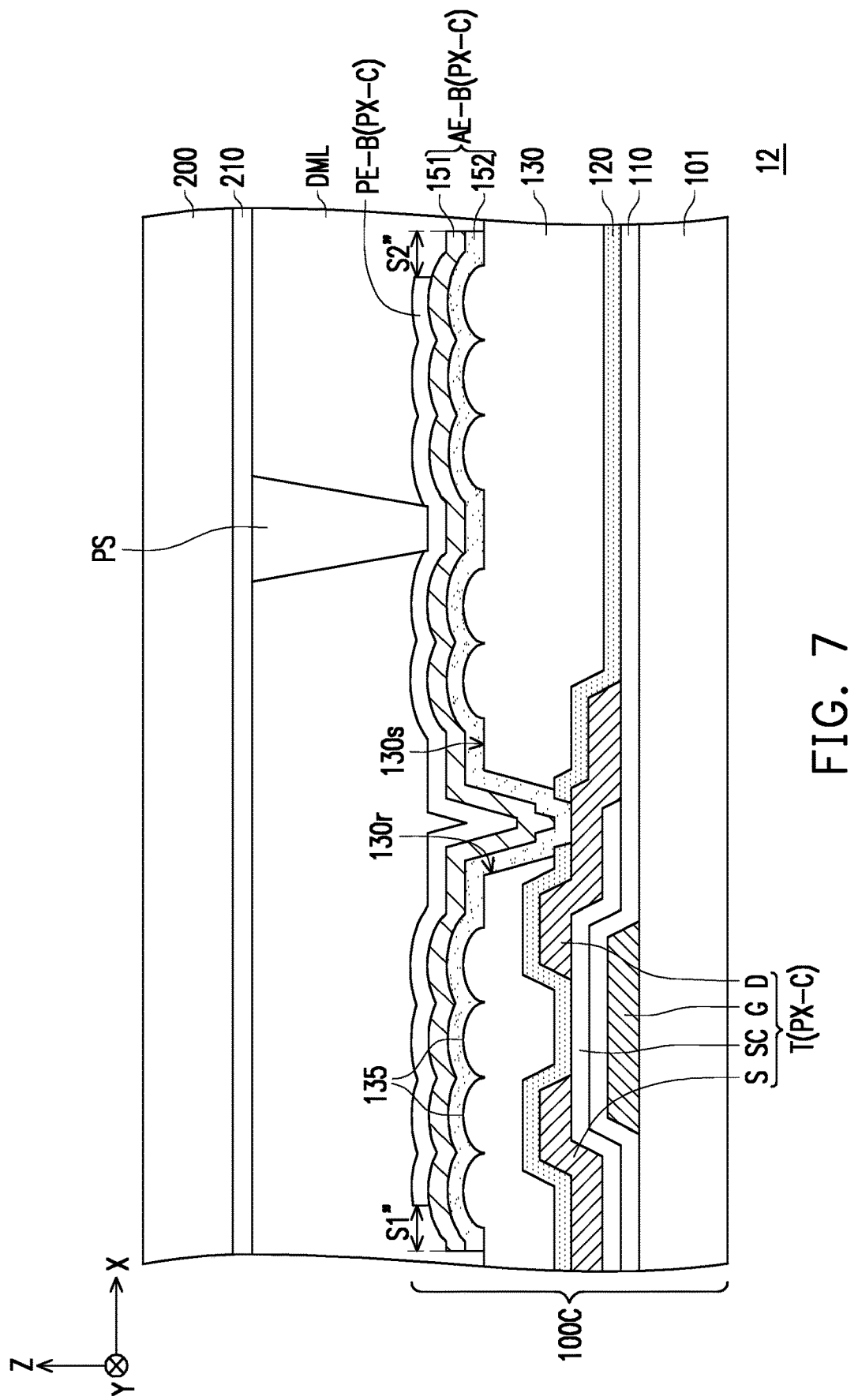
FIG. 7 is a schematic cross-sectional view of a display device according to a fourth embodiment of the disclosure.

FIG. 7 is a schematic cross-sectional view of a display device according to a fourth embodiment of the disclosure. Referring to FIG. 7, a difference between a display device 12 of the present embodiment and the display device 11 of FIG. 6 is that: compositions of auxiliary electrodes are different. In particular, an auxiliary electrode AE-B of a pixel structure PX-C of the pixel array substrate 100C is a stacked structure of a metal layer 151 and a metal oxide layer 152, and the metal oxide layer 152 is disposed between the metal layer 151 and a flat layer 130. In the present embodiment, the metal layer 151 is made of molybdenum, aluminum, or molybdenum aluminum alloy, and the metal oxide layer 152 is made of indium tin oxide, but the disclosure is not limited thereto.

For example, a vertical projection of the metal layer 151 on a substrate 101 may completely overlap a vertical projection of the metal oxide layer 152 on the substrate 101. More particular, in the present embodiment, a metal layer 151 of the auxiliary electrode AE-B may be aligned with the metal oxide layer 152 in a normal direction (for example, a direction Z) of the substrate 101. However, the disclosure is not limited to thereto. According to other embodiments, a metal layer of the auxiliary electrode may not be aligned with the metal oxide layer and may expose a part of a surface of the metal oxide layer. In other words, an area of a vertical projection of the metal oxide layer of the auxiliary electrode on the substrate 101 is optionally greater than an area of a vertical projection of the metal layer on the substrate 101.

Figure 8:
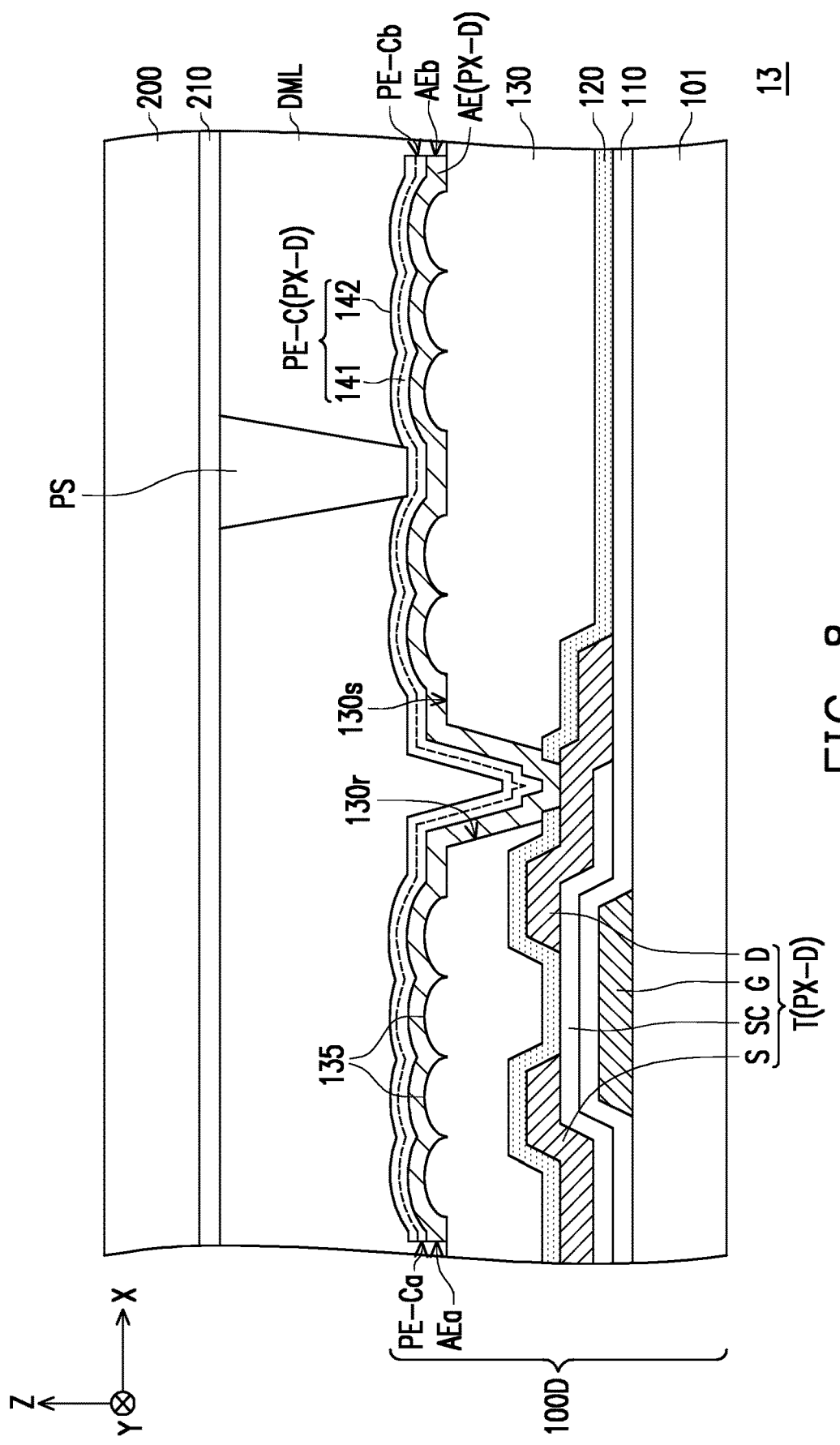
FIG. 8 is a schematic cross-sectional view of a display device according to a fifth embodiment of the disclosure.

FIG. 8 is a schematic cross-sectional view of a display device according to a fifth embodiment of the disclosure. Referring to FIG. 8, a difference between a display device 13 of the present embodiment and the display device 10 of FIG. 2 is that: configurations of reflective electrodes are different. In the present embodiment, a reflective electrode PE-C of a pixel structure PX-D of a pixel array substrate 100D may be aligned with an auxiliary electrode AE in a direction Z. For example, a side edge PE-Ca and a side edge PE-Cb of the reflective electrode PE-C of the pixel structure PX-D of the pixel array substrate 100D may be aligned with a side edge AEa and a side edge AEb of the auxiliary electrode AE, respectively. In other words, a width of the reflective electrode PE-C of the pixel structure PX-D in a direction X may be equal to a width of the auxiliary electrode AE in the direction X. More particular, in the present embodiment, an area of a vertical projection of the reflective electrode PE-C of the pixel structure PX-D on the substrate 101 is optionally equal to an area of a vertical projection of the auxiliary electrode AE on the substrate 101, but the disclosure is not limited thereto.

Based on the foregoing, in the pixel array substrate and the display device provided by an embodiment of the disclosure, in order to improve the adhesion between the reflective electrode and the flat layer, the auxiliary electrode is sandwiched between the reflective electrode and the flat layer of the pixel structure. Further, the area of the vertical projection of the reflective electrode on the substrate is not greater than the area of the vertical projection of the auxiliary electrode on the substrate. Accordingly, a process margin of the pixel array substrate may be increased, such that the production yield of the display device is improved.

Finally, it should be noted that: the foregoing embodiments are merely used for describing the technical solutions of the disclosure, but are not intended to limit the disclosure. Although the disclosure is described in detail with reference to the foregoing embodiments, a person of ordinary skill in the art should understand that: modifications may still be made to the technical solutions in the foregoing embodiments, or equivalent replacements may be made to some or all of the technical features; and such modifications or replacements will not cause the essence of corresponding technical solutions to depart from the scope of the technical solutions in the embodiments of the disclosure.

What is claimed is:
1. Pixel array substrate, comprising:
a substrate comprising a plurality of pixel regions;
a plurality of pixel structures correspondingly disposed in the plurality of pixel regions of the substrate, at least one of the pixel structures comprising:
an active element;

a reflective electrode disposed in a corresponding one of the pixel regions and electrically connected to the active element; and an auxiliary electrode electrically connected to the reflective electrode and the active element, wherein a vertical projection of the reflective electrode on the substrate overlaps a vertical projection of the auxiliary electrode on the substrate, an area of the vertical projection of the reflective electrode on the substrate is not greater than an area of the vertical projection of the auxiliary electrode on the substrate, the auxiliary electrode has a first width in a first direction, the reflective electrode has a second width in the first direction, a reflectivity of the auxiliary electrode is greater than 88%, and a difference between the first width and the second width is less than or equal to 11 µm; and a flat layer disposed between the auxiliary electrode and the active element and covering the active element, wherein the auxiliary electrode directly contacts the flat layer and the reflective electrode, the reflective electrode comprises a first surface facing away from the substrate, the auxiliary electrode comprises a second surface not covered by the reflective electrode, and the first surface and the second surface define a reflective surface of the pixel structure.

2. Pixel array substrate according to claim 1, wherein the auxiliary electrode is made of a metal oxide.

3. Pixel array substrate according to claim 1, wherein the auxiliary electrode comprises a first side edge and a second side edge opposite to each other in the first direction, the reflective electrode comprises a third side edge and a fourth side edge opposite to each other in the first direction, a first distance is provided between the first side edge and the third side edge, a second distance is provided between the second side edge and the fourth side edge, and a sum of the first distance and the second distance is less than or equal to 11 µm.

4. Pixel array substrate according to claim 1, wherein the auxiliary electrode is made of metal or alloy.

5. Pixel array substrate according to claim 4, wherein the difference between the first width and the second width is greater than or equal to 0.5 µm and less than or equal to 4.5 µm.

6. Pixel array substrate according to claim 4, wherein the auxiliary electrode comprises a first side edge and a second side edge opposite to each other in the first direction, the reflective electrode comprises a third side edge and a fourth side edge opposite to each other in the first direction, a first distance is provided between the first side edge and the third side edge, a second distance is provided between the second side edge and the fourth side edge, and one of the first distance and the second distance is greater than or equal to 0.25 µm and less than or equal to 2.25 µm.

7. Pixel array substrate according to claim 1, wherein the reflective electrode is a stacked structure of a transparent protective layer and a metal reflective layer, and the metal reflective layer is disposed between the transparent protective layer and the auxiliary electrode.

8. Pixel array substrate according to claim 1, wherein reflectivity of the auxiliary electrode in a visible light band is different from reflectivity of the reflective electrode in the visible light band.

9. Pixel array substrate according to claim 1, wherein the reflective electrode is made of silver or silver alloy, the auxiliary electrode is a stacked structure of a metal layer and a metal oxide layer, and the metal oxide layer is disposed between the metal layer and the flat layer.

10. Display device, comprising:
a pixel array substrate comprising:
a substrate comprising a plurality of pixel regions;
a plurality of pixel structures correspondingly disposed in the plurality of pixel regions of the substrate, and at least one of the pixel structures comprising:
an active element;
a reflective electrode disposed in a corresponding one of the pixel regions and electrically connected to the active element; and
an auxiliary electrode electrically connected to the reflective electrode and the active element, wherein a vertical projection of the reflective electrode on the substrate overlaps a vertical projection of the auxiliary electrode on the substrate, an area of the vertical projection of the reflective electrode on the substrate is not greater than an area of the vertical projection of the auxiliary electrode on the substrate, the auxiliary electrode has a first width in a first direction, the reflective electrode has a second width in the first direction, a reflectivity of the auxiliary electrode is greater than 88%, and a difference between the first width and the second width is less than or equal to 11 µm; and
a flat layer disposed between the auxiliary electrode and the active element and covering the active element, wherein the auxiliary electrode directly contacts the flat layer and the reflective electrode, the reflective electrode comprises a first surface facing away from the substrate, the auxiliary electrode comprises a second surface not covered by the reflective electrode, and the first surface and the second surface define a reflective surface of the pixel structure;
a display medium layer; and
an opposite substrate, wherein the display medium layer is sandwiched between the pixel array substrate and the opposite substrate.

11. Display device according to claim 10, wherein the reflective electrode is made of silver or a silver alloy, and the flat layer is made of an organic insulating material.

12. Display device according to claim 10, wherein the auxiliary electrode is made of a metal oxide.

13. Display device according to claim 10, wherein the auxiliary electrode comprises a first side edge and a second side edge opposite to each other in the first direction, the reflective electrode comprises a third side edge and a fourth side edge opposite to each other in the first direction, a first distance is provided between the first side edge and the third side edge, a second distance is provided between the second side edge and the fourth side edge, and a sum of the first distance and the second distance is less than or equal to 11 µm.

14. Display device according to claim 10, wherein the auxiliary electrode is made of metal or alloy.

15. Display device according to claim 14, wherein the difference between the first width and the second width is greater than or equal to 0.5 µm and less than or equal to 4.5 µm.

16. Display device according to claim 14, wherein the auxiliary electrode comprises a first side edge and a second side edge opposite to each other in the first direction, the reflective electrode comprises a third side edge and a fourth side edge opposite to each other in the first direction, a first distance is provided between the first side edge and the third side edge, a second distance is provided between the second side edge and the fourth side edge, and one of the first distance and the second distance is greater than or equal to 0.25 μm and less than or equal to 2.25 μm.

* * * * *